US010608355B2

(12) United States Patent
Chen et al.

(10) Patent No.: US 10,608,355 B2
(45) Date of Patent: Mar. 31, 2020

(54) TOOL-LESS TOP SERVICE OF M.2 LATCH ON BOARD

(71) Applicant: QUANTA COMPUTER INC., Taoyuan (TW)

(72) Inventors: Chao-Jung Chen, Taoyuan (TW); Yaw-Tzorng Tsorng, Taoyuan (TW); Jui-Tang Chang, Taoyuan (TW); Chun Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/891,014

(22) Filed: Feb. 7, 2018

(65) Prior Publication Data

US 2019/0074614 A1  Mar. 7, 2019

Related U.S. Application Data

(60) Provisional application No. 62/554,779, filed on Sep. 6, 2017.

(51) Int. Cl.
*H01R 12/70* (2011.01)
*H05K 1/18* (2006.01)
(Continued)

(52) U.S. Cl.
CPC ......... *H01R 12/7005* (2013.01); *G06F 1/185* (2013.01); *G06F 1/186* (2013.01);
(Continued)

(58) Field of Classification Search
CPC ............... H01R 12/7005; H01R 12/73; H01R 12/7076; H05K 1/181; H05K 2201/10598; H05K 2201/10409; H05K 2201/10159
(Continued)

(56) References Cited

U.S. PATENT DOCUMENTS 8,085,552 B2 * 12/2011 Takao ............... G06F 1/185
                                              361/807
8,649,182 B2 *  2/2014 Ko .................. G06F 1/1633
                                              361/755
(Continued)

FOREIGN PATENT DOCUMENTS

CA        2101837 A1     2/1995
CN      102686058 A      9/2012
(Continued)

OTHER PUBLICATIONS

Extended European Search Report for EP Application No. 18169195.7, dated Oct. 9, 2018.
(Continued)

*Primary Examiner* — Rockshana D Chowdhury
(74) *Attorney, Agent, or Firm* — Nixon Peabody LLP; Zhou Lu

(57) ABSTRACT

The present disclosure provides a computing device. The computing device includes an electronic component. The computing device also includes a printed circuit board assembly (PCBA). The PCBA includes at least two latch receiving spaces. The two latch receiving spaces are positioned on the PCBA to accommodate various sizes of the electronic component. The computing device also includes a latch assembly for securing the electronic component. The latch assembly is connected to the PCBA at one of the at least two latch receiving spaces.

13 Claims, 6 Drawing Sheets

(51) Int. Cl.
  *H01R 12/73* (2011.01)
  *H05K 1/14* (2006.01)
  *G06F 1/18* (2006.01)
(52) U.S. Cl.
  CPC ......... *G06F 1/187* (2013.01); *H01R 12/7076* (2013.01); *H01R 12/73* (2013.01); *H05K 1/141* (2013.01); *H05K 1/181* (2013.01); H05K 2201/042 (2013.01); H05K 2201/10159 (2013.01); H05K 2201/10409 (2013.01); *H05K 2201/10598* (2013.01)
(58) Field of Classification Search
  USPC ..................................................... 361/679.58
  See application file for complete search history.

(56) References Cited

U.S. PATENT DOCUMENTS

| | | | | |
|---|---|---|---|---|
| 2009/0180264 A1* | 7/2009 | Chiang | .................. | H05K 7/142 361/752 |
| 2016/0091924 A1* | 3/2016 | Aoki | .................. | F16M 11/2007 361/679.09 |
| 2016/0165738 A1 | 6/2016 | Zhu | | |
| 2016/0249455 A1* | 8/2016 | Yang | ....................... | G06F 1/185 |
| 2017/0090527 A1 | 3/2017 | Chi | | |
| 2017/0220080 A1 | 8/2017 | Schulze et al. | | |

FOREIGN PATENT DOCUMENTS

| | | |
|---|---|---|
| CN | 103777687 A | 5/2014 |
| CN | 103813676 A | 5/2014 |
| CN | 105794328 A | 7/2016 |
| CN | 106997229 A | 8/2017 |
| CN | 107102705 A | 8/2017 |
| JP | 49-009956 | 5/1972 |
| JP | 62-202515 U | 12/1987 |
| JP | 2011012766 A | 1/2011 |

OTHER PUBLICATIONS

Extended European Search Report for EP Application No. 18169195.7, dated Nov. 28, 2019.
JP Office Action for Application No. 2018-096175, dated Jul. 29, 2019, w/ Second Office Action Summary.
CN Office Action for Application No. 201810442057.5, dated Feb. 3, 2020, w/ First Office Action Summary.
CN Search Report for Application No. 201810442057.5, dated Feb. 3, 2020, w/ First Office Action.

* cited by examiner

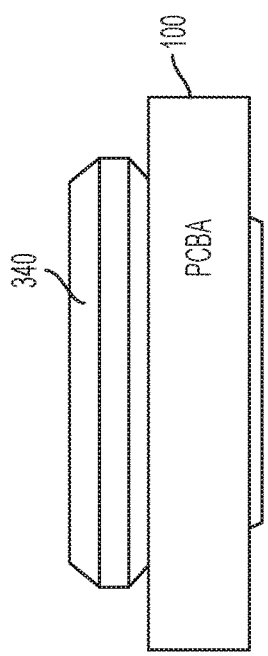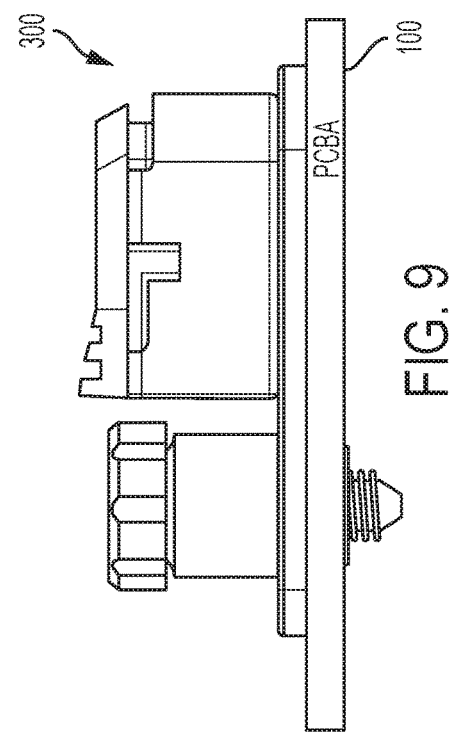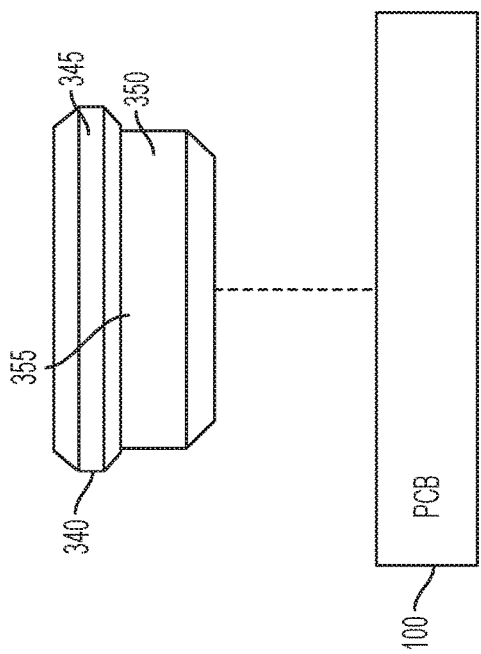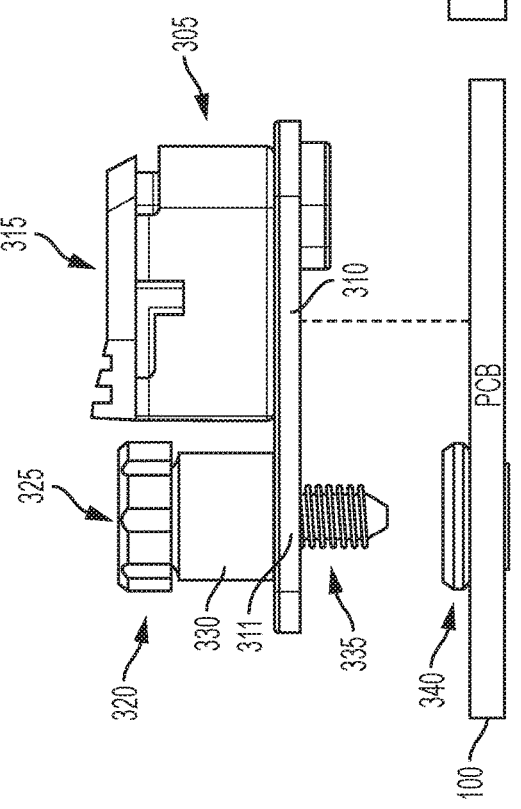

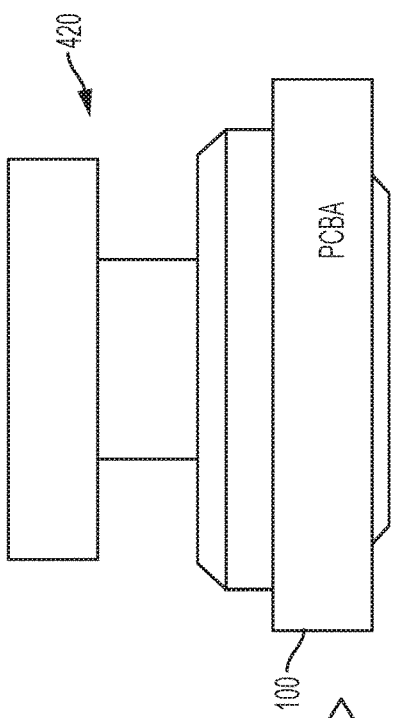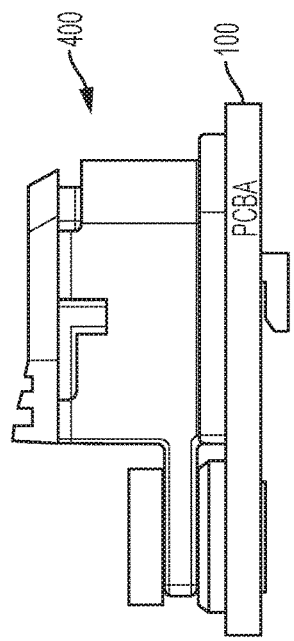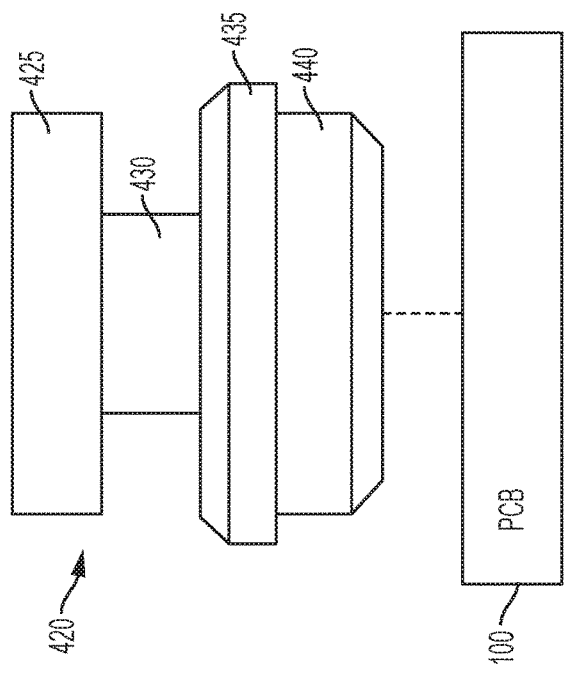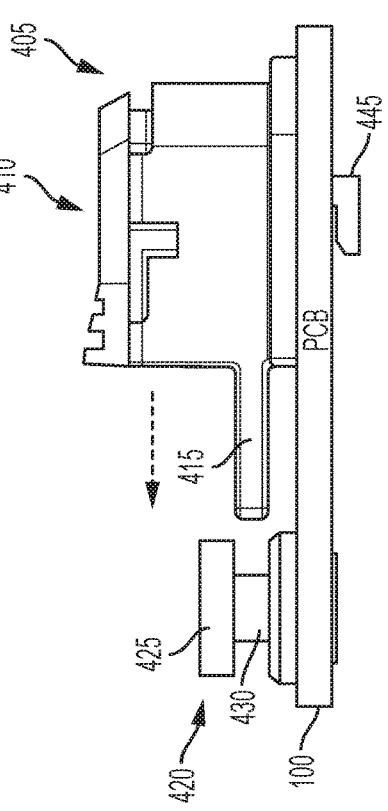
FIG. 10
FIG. 11
FIG. 12
FIG. 13

TOOL-LESS TOP SERVICE OF M.2 LATCH ON BOARD

CROSS REFERENCE TO RELATED APPLICATIONS

This application claims priority to U.S. Provisional Application No. 62/554,779 entitled "TOOL-LESS TOP SERVICE OF M.2 LATCH ON BOARD", filed on Sep. 6, 2017, the contents of which are incorporated by reference in its entirety.

FIELD OF THE INVENTION

The disclosure relates generally to a latch assembly configured to secure solid state drive (SSD) devices of varying sizes and length within a computing system.

BACKGROUND

A solid-state drive (SSD) is a memory data storage device that utilizes solid-state memory to store persistent data. Solid-state memory can include, for example, flash-type "non-volatile" memory or synchronous dynamic access memory (SDRAM) "volatile" memory. SSDs are an alternative to conventional hard disk drives that have slower memory data access times due to the mechanical moving parts. The absence of rotating disks and mechanical devices in the SSD greatly improves electro-magnetic-interference (EMI), physical shock resistance, and reliability.

SSD devices in the market tend to vary in size. Removing an SSD device from many types of computer systems today requires tools. Furthermore, removing an SSD device from many types of computer systems involves pulling cables from cable sockets. Over time, or through incorrect usage, these cables or sockets become frail and can introduce data transfer errors associated with the SSD in use. Installing an SSD device is not any easier because it involves similar hardships.

Furthermore, a computer data center (also referred to as an Internet data center or an enterprise data center) may contain a myriad of computer systems utilizing various SSDs. The large number of high-capacity SSDs in a data center poses significant problems associated with their removal and installation. The time and skills involved in removing or installing SSDs in a data center, without damage, can become burdensome. Accordingly, it is becoming increasingly important to be able to easily, quickly, and efficiently remove and install an SSD device in a computer system.

SUMMARY

The present disclosure provides computing device. The computing device includes an electronic component. The computing device also includes a printed circuit board assembly (PCBA). The PCBA includes at least two latch receiving spaces. The two latch receiving spaces are positioned on the PCBA to accommodate various sizes of the electronic component. The computing device also includes a latch assembly for securing the electronic component. The latch assembly is connected to the PCBA at one of the at least two latch receiving spaces. The latch assembly includes a securing element connected to a printed circuit board assembly (PCBA). The securing element can include at least two cylindrical elements, where the two cylindrical elements can include two different sizes. The latch assembly can also include a latch mechanism. The latch mechanism can include a connection component configured to secure the latch mechanism to the securing element via at least one cylindrical element of the at least two cylindrical elements.

In one aspect of the present disclosure, the connection component of the latch mechanism can include a magnet configured to connect to the at least one cylindrical element of the securing element. In some embodiments of the disclosure, the securing element can be configured to connect to the latch mechanism via an aperture within the PCBA. The at least one cylindrical element and the aperture within the PCBA can have corresponding circumferences that allows for a perfect fit between the two parts. In some embodiments of the disclosure, a second cylindrical element of the at least two cylindrical elements can be configured to reside flush against a bottom surface of the PCBA. In some embodiments, the at least one cylindrical element of the securing element includes a tapered feature comprising a magnetic metal component. In some embodiments of the disclosure, a second cylindrical element of the at least two cylindrical elements can be configured to reside flush against a top surface of the PCBA. The connection component of the latch mechanism can include a notch feature configured to connect to a third cylindrical element of the at least two cylindrical elements of the securing element. Furthermore, the latch mechanism can include a tab feature that is configured to connect to the PCBA via a second aperture.

The present disclosure provides a latch assembly for securing an electronic component within a computing device. The latch assembly includes a securing element connected to a printed circuit board assembly (PCBA). The securing element can include at least two cylindrical elements. The two cylindrical elements can include two different sizes. The latch assembly also includes a base. The base can include a first connection component that connects the base to the securing element. The latch assembly can also include a latch mechanism. The latch mechanism includes a second connection component that connects the latch mechanism to the securing element via at the base.

In one aspect of the present disclosure, the securing element can include a connecting assembly that connects to a first receiving space of the base. In some embodiments of the disclosure, the connecting assembly can include a threaded screw, a bolt, or a non-threaded connecting feature. The receiving space of the base can include a corresponding threaded interior to secure the connecting assembly. In some embodiments of the disclosure, the base can include a second receiving space that connects to the connection component of the latch component. In some embodiments, the second connection component can include a notch feature, a spring feature, or a magnetic feature, each that connects the latch mechanism to the base. In some embodiments of the disclosure, the latch mechanism and the base can be connected in a flush configuration and detachable upon asserting force.

In some embodiments of the disclosure, the base can include a tool-less feature configured to drive the first connection component into the securing element, a spacer, and the first connection component. The first connection component can include a threaded screw that connects to a receiving space of the securing element. Furthermore, the tool-less feature can include either a knob or a thumb-screw configured to turn the threaded screw into the receiving space of the securing element. In some embodiments, the second connection component can include a platform extended horizontally from the latch mechanism towards the base and the securing element. The platform can include an aperture configured to receive the first connection component of the base and enable connection between the base and the securing element. Moreover, the connection of the base and the securing element via the aperture in the platform of the latch mechanism can secure the latch mechanism in place on the PCBA.

Although many of the examples are described herein with reference to enclosing a solid state drive (SSD) device, it should be understood that these are only examples, and the present disclosure is not limited in this regard. Rather, any electronic component installed within a computer data center can be implemented within the disclosed enclosure.

Additional features and advantages of the disclosure will be set forth in the description that follows, and in part, will be obvious from the description, or can be learned by practice of the principles disclosed herein. The features and advantages of the disclosure can be realized and obtained by means of the instruments and combinations particularly pointed out in the appended claims. These and other features of the disclosure will become fully apparent from the following description and appended claims, or can be learned by the practice of the principles set forth herein.

BRIEF DESCRIPTION OF THE DRAWINGS

In order to describe the manner in which the above-recited and other advantages and features of the disclosure can be obtained, a more particular description of the principles described above will be rendered by reference to specific examples illustrated in the appended drawings. These drawings depict only example aspects of the disclosure, and are therefore not to be considered as limiting of its scope The principles are described and explained with additional specificity and detail through the use of the following drawings.

FIG. 6 illustrates the assembly of a securing element with the PCBA, according to a second embodiment of a latch assembly.

FIG. 7 illustrates the configuration of securing element and the PCBA of FIG. 6, according to the second embodiment of the latch assembly.

FIG. 8 illustrates the assembly of a latch mechanism, a base, the securing element, and the PCBA of FIG. 7, according to the second embodiment of the latch assembly.

FIG. 9 illustrates the configuration of the second embodiment of the latch assembly.

FIG. 10 illustrates the assembly of a securing element with the PCBA, according to a third embodiment of a latch assembly.

FIG. 11 illustrates the configuration of securing element and the PCBA of FIG. 10, according to the third embodiment of the latch assembly.

FIG. 12 illustrates the assembly of a latch mechanism, the securing element, and the PCBA of FIG. 11, according to the third embodiment of the latch assembly.

FIG. 13 illustrates the configuration of the third embodiment of the latch assembly.

DETAILED DESCRIPTION

Figure 1A:
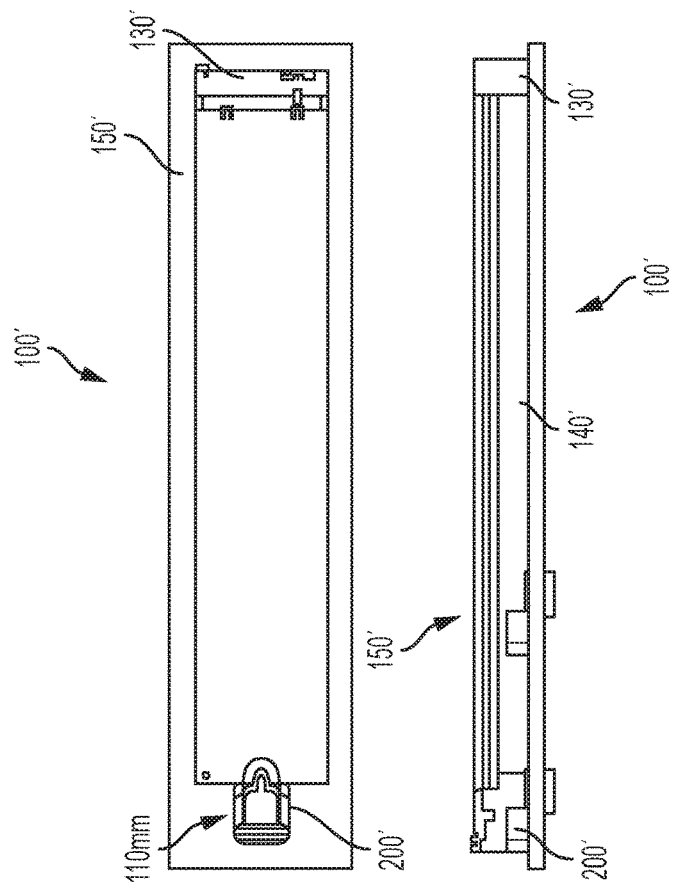
FIG. 1A shows an exemplary embodiment of a printed circuit board assembly (PCBA) 100, in accordance with an implementation of the present disclosure.

The present invention is described with reference to the attached figures, wherein like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As discussed above, there is significant interest in developing means to efficiently and reliably remove and install SSD devices, of varying sizes, into a computer system. In particular, there is significant interest in developing mechanisms that: (1) do not require tools to install an SSD into a computer system; (2) embody a modifiable configuration in accordance with varying size SSD devices; (3) minimize space requirements for the SSD and supporting hardware in the computer system; and/or (4) reduce or eliminate instances of incorrect installation of the SSD, which can result in damage to the SSD, the computer system, or connectors between them.

In view of the foregoing, the present disclosure contemplates various embodiments of latching mechanisms for removing and installing an SSD device onto a printed circuit board assembly within a computer system. In particular, the present disclosure contemplates a tool-less latching mechanism design that allows a technician to easily and reliably install an SSD device onto a printed circuit board assembly. Such a design is illustrated in FIGS. 1-17.

FIG. 1A shows an exemplary embodiment of a printed circuit board assembly (PCBA) 100, in accordance with an implementation of the present disclosure. The PCBA 100 can be any size, shape and/or design (e.g., form factor) known to those of skill in the art. The PCBA 100 can include any number and variety of electrical components (e.g., processors, memory, etc.) coupled to either surface of the PCBA 100 (e.g., top and/or bottom). Furthermore, the PCBA 100 can have a receiving space 140 for an expansion card. In some embodiments, the expansion card can include a M.2 80 mm solid state drive (SSD) 150. In alternative embodiments, the expansion card can include a M.2 110 mm solid state drive (SSD) 150. Thus, the receiving space 140 can be configured for either an 80 mm SSD device or a 110 mm SSD device. For the purposes of the present disclosure, the description is directed towards a M.2 SSD. However, it should be apparent that various expansion card configurations may be implemented herein.

The PCBA 100 can have a latch assembly 200 coupled to assist in coupling and decoupling the SSD 150. In the exemplary embodiment, the PCBA 100 includes a connector 130 for sustaining an electrical connection with the SSD 150. The connector 130 includes pins which, when in contact with pins of the SSD 150, allow for an exchange of electrical signals between the SSD 150 and the electrical components on the PCBA 100.

Figure 1B:
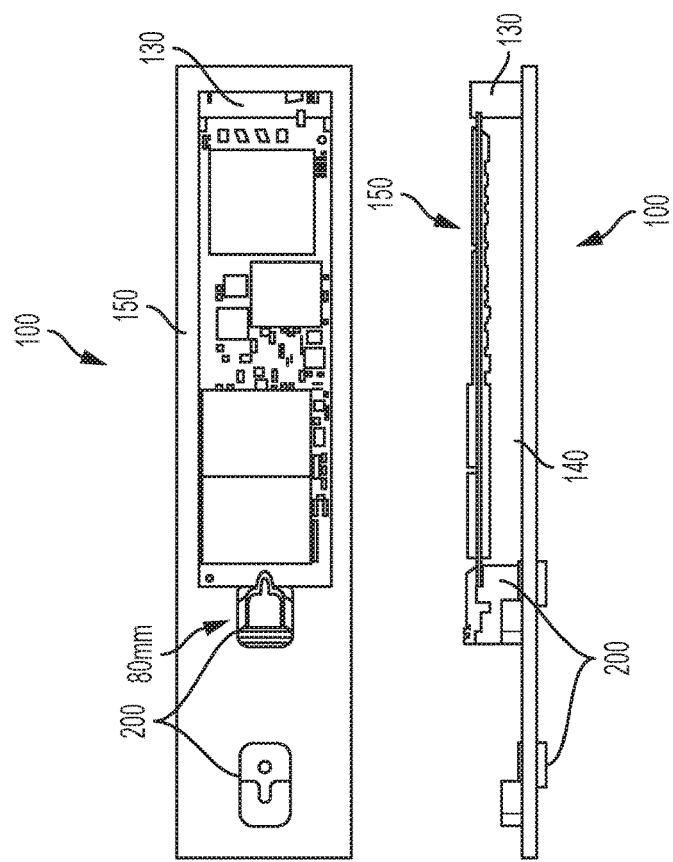
FIG. 1B shows an exemplary embodiment of a PCBA 100', in accordance with an implementation of the present disclosure.

FIG. 1B shows an exemplary embodiment of a printed circuit board assembly (PCBA) 100', in accordance with an implementation of the present disclosure. Similar to PCBA 100 in FIG. 1A, the PCBA 100' can be any size, shape, and/or design (e.g., form factor) known to those of skill in the art. The PCBA 100' can have a receiving space 140' for an expansion card. For the purposes of this application, FIG. 1B exemplifies an expansion card with a greater length than the SSD device 150 of FIG. 1A. For example, the expansion card can include a M.2 110 mm solid state drive (SSD) 150'. Thus, the receiving space 140' can be configured for a 110 mm SSD device 150'. For the purposes of the present disclosure, the description is directed towards a M.2 SSD. However, it should be apparent that various expansion card configurations may be implemented herein.

Similar PCBA 100 in FIG. 1A, the PCBA 100' can have a latch assembly 200' coupled to assist in coupling and decoupling the SSD 150'. In the exemplary embodiment, the PCBA 100' includes a connector 130' for sustaining an electrical connection with the SSD 150'. The connector 130' includes pins which, when in contact with pins of the SSD 150', allow for an exchange of electrical signals between the SSD 150' and the electrical components on the PCBA 100'. The latch assembly 200' is set back a further distance from the connector 130' to account for the 110 mm SSD device 150'. Specifically, where an 80 mm SSD device is replaced for a 110 mm SSD device, the latch assembly can easily be moved to the corresponding location for the 110 mm SSD device. Alternatively, in the event the 110 mm SSD device is replaced for an 80 mm SSD device, the latch assembly can easily be moved to the corresponding location for the 80 mm SSD device. To accomplish this functionality, the latch assembly is configurable without the need for tools. In addition, the latch assembly embodies an easy modifiable configuration. The latch assembly is discussed in greater detail below with respect to FIGS. 2-17.

Referring now to FIGS. 2-5, FIG. 5 illustrates a first embodiment of a latch assembly 200 secured to the PCBA 100. As described above, the latch assembly 200 secures the SSD 150, 150' (shown in FIG. 1A-B) to the PCBA 100, 100' (shown in FIG. 1A-1B). The latch assembly 200 includes a latch mechanism 205, a base 215, and a securing element 230. The latch mechanism 205 can include a connecting feature 210. The base 215 can include a first receiving space 220, and a second receiving space 225. The securing element 230 can include a connecting assembly 235.

The latch assembly 200 and its components can be made from a single flexible yet durable element, such as plastic. In some embodiments, the latch mechanism 205 and the base 215 can be made from a single flexible yet durable element, while the securing element 230 is made from more rigid materials. Because the securing element 230 is rigid in comparison with the latch mechanism 205 and the base 215, the securing element 230 and its components can be made of sheet metal using conventional metal fabrication techniques such as bending, forming, and stamping. As a result, the securing element 230 can be made inexpensively. Alternatively, the securing element 230 and its components can be made of aluminum alloy, steel alloy, or any combination thereof.

Furthermore, the latch assembly 200 and its components can be made of any material constructed to withstand varying temperatures, and air flow of high velocity (from a plurality of fan modules not shown). The materials mentioned above are only for example, and not intended to limit this disclosure. A person having ordinary knowledge in the art may flexibly select any material in accordance with the disclosure.

Figure 2:
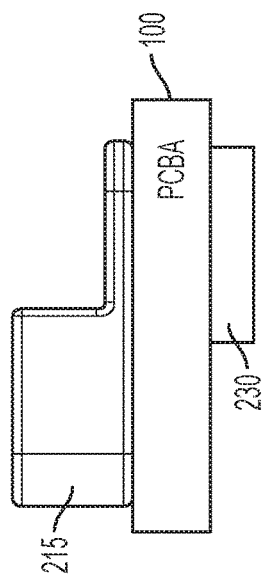
FIG. 2 illustrates the assembly of a base and a securing element with the PCBA, according to a first embodiment of a latch assembly.
Figure 3:
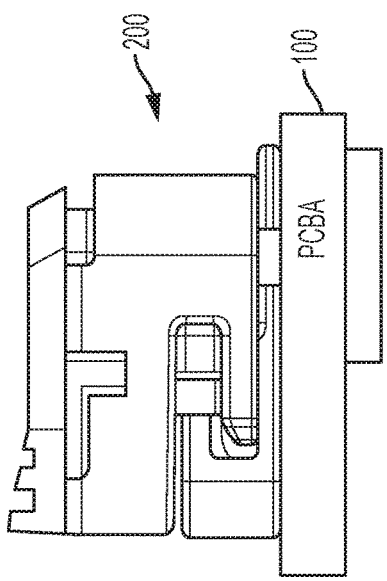
FIG. 3 illustrates the configuration of the base, securing element and the PCBA of FIG. 2, according to the first embodiment of the latch assembly.

As shown in FIG. 2, the PCBA 100 can include an aperture (not shown) configured to receive the connecting assembly 235 of the securing element 230. The connecting assembly 235 can be cylindrical in shape. The length of the connecting assembly 235 can be configured to extend through the PCBA 100 into the second receiving space 225. The second receiving space 225 of the base 215 can be configured to receive the connecting assembly 235 through the aperture (not shown) of the PCBA 100. The connecting assembly 235 can include a threaded screw, a bolt, or a non-threaded connecting feature. The second receiving space 225 can include a corresponding threaded interior, or any other known features to receive and secure the connecting assembly 235. FIG. 3 illustrates the securing element 230 connected to the base 215 via the PCBA 100.

Figure 4:
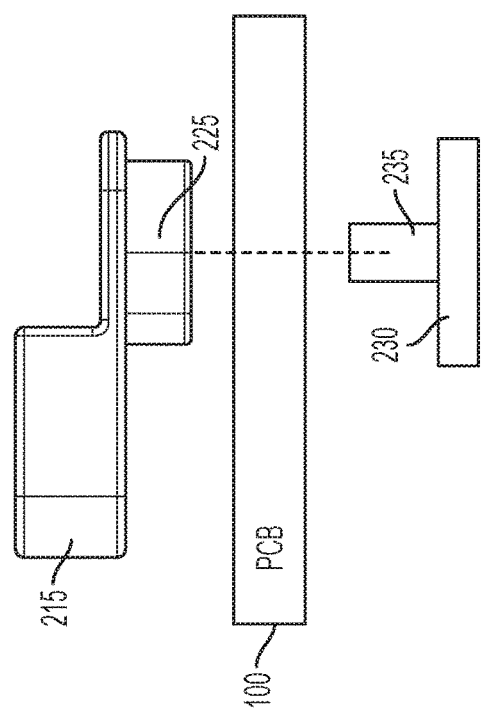
FIG. 4 illustrates the assembly of a latch mechanism, the base and the PCBA of FIG. 3, according to the first embodiment of the latch assembly.
Figure 5:
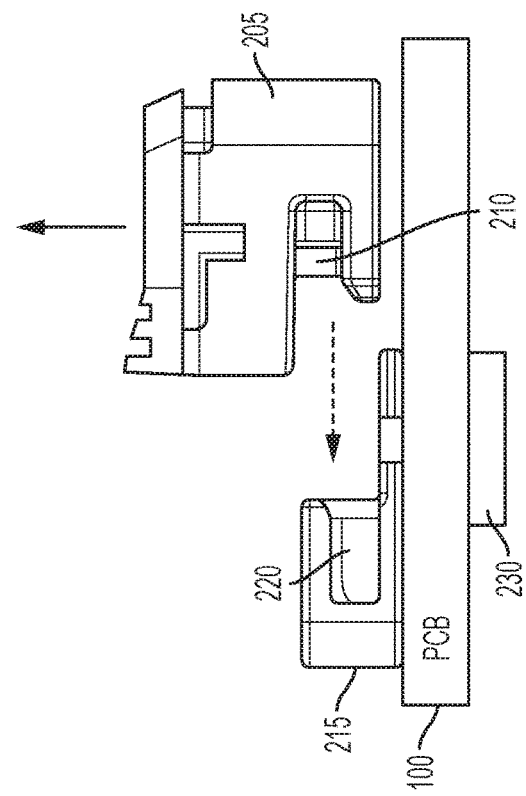
FIG. 5 illustrates the configuration of the first embodiment of the latch assembly.

As shown in FIG. 4, the base 215 can include a first receiving space 220 configured to receive the connecting feature 210 of the latch mechanism 205. The connecting feature 210 of the latch mechanism 205 can include a notch feature, a spring feature, a magnetic feature or any other known mechanical features configured to connect the latch mechanism 205 to the base 215. In preferred embodiments, the connection between the latch mechanism 205 and the base 215 is flush and detachable upon asserting force. The assembly of the latch mechanism 205 and the base 215 is tool less and configurable without being onerous on a technician. FIG. 5 illustrates the latch assembly 200 secured to the PCBA 100.

Referring now to FIGS. 6-9, FIG. 9 illustrates a second embodiment of a latch assembly 300 secured to the PCBA 100. As described above, with respect to the latch assembly 200, the latch assembly 300 secures the SSD 150, 150' (shown in FIG. 1A-B) to the PCBA 100, 100' (shown in FIG. 1A-1B). The latch assembly 300 includes a latch mechanism 305, a base 320, and a securing element 340. The latch mechanism 305 can include a platform 310, an aperture 311, and a latch 315. The base 320 can include a tool-less knob 325, a spacer 330, and a threaded screw 335. The securing element 340 can include a first feature 345, a second feature 350 and a receiving space 355. The securing element 340, including the first feature 345, a second feature 350 and a receiving space 355, can be cylindrical in shape.

The latch assembly 300 and its components can be made from a single flexible yet durable element, such as plastic. In some embodiments, the latch mechanism 305 and the base 320 can be made from a single flexible yet durable element, while the securing element 340 is made from more rigid materials. Because the securing element 340 is rigid in comparison with the latch mechanism 305 and the base 320, the securing element 340 and its components can be made of sheet metal using conventional metal fabrication techniques such as bending, forming, and stamping. As a result, the securing element 340 can be made inexpensively. Alternatively, the securing element 340 and its components can be made of aluminum alloy, steel alloy, or any combination thereof.

Furthermore, the latch assembly 300 and its components can be made of any material constructed to withstand varying temperatures, and air flow of high velocity (from a plurality of fan modules not shown). The materials mentioned above are only for example, and not intended to limit this disclosure. A person having ordinary knowledge in the art may flexibly select any material in accordance with the disclosure.

As shown in FIG. 6, the PCBA 100 can include an aperture (not shown) configured to receive the second feature 350 of the securing element 340. The second feature 350 of the securing element 340 can include a tapered area configured to be inserted within the PCBA 100. The second feature 350 and the aperture (not shown) of the PCBA 100 can have corresponding circumferences (where the aperture is slightly larger) that allows for a perfect fit between the two parts. In other embodiments, the second feature 350 and the aperture (not shown) of the PCBA 100 can have an interference fit—where the condition of fit (contact) between the two parts requires pressure to force the parts together. The first feature 345 of the securing element 340 can include a larger circumference than the second feature 350 of the securing element 340. In this way, first feature 345 of the securing element 340 can sit on the top surface of the PCBA 100, as shown in FIG. 7.

As shown in FIG. 8, the base 320 is configured to secure the latch mechanism 305 to the PCBA 100 via the securing element 340 installed within the PCBA 100. The latch mechanism 305 can include a platform 310, an aperture 311, and a latch 315. The platform 310 is connected to the body of the latch 315. In some embodiments, the platform 310 and the latch 315 are formed as a unibody structure. In other embodiments, the platform 310 and the latch 315 are connected by molding, welding, stamping, extrusion, brass, CNC, or any other available shaping process. The platform 310 can include an aperture 311 configured to receive the threaded screw 335 of the base 320. In alternative embodiments, the base 320 and the latch mechanism 305 can be configured as one individual part.

The base 320 can include a tool-less knob 325, a spacer 330, and a threaded screw 335. The tool-less know 325 is configured to turn the threaded screw 335 into the receiving space 355 of the securing element 340. The spacer 330 is configured to house a significant portion of the threaded screw 335 as it is being extended and extracted by the turning of the tool-less knob 325. It should be noted, that any tool-less feature (e.g., tool-less knob 325, a thumb screw, etc.) that drives and secures a connecting feature (e.g., threaded screw 335) into the receiving space 355 of the securing element 340 can be implemented herein. The threaded screw 335 can include not only be a threaded screw; in some embodiments, the feature can include a bolt, or a non-threaded connecting feature. The receiving space 335 of the securing element 340 can include a corresponding threaded interior, or any other known features to receive and secure the threaded screw 335.

The assembly of the latch mechanism 305, the base 320, and the securing element 340 is tool less and configurable without being onerous on a technician. FIG. 9 illustrates the latch assembly 300 secured to the PCBA 100.

Referring now to FIGS. 10-13, FIG. 13 illustrates a third embodiment of a latch assembly 400 secured to the PCBA 100. As described above, with respect to the latch assembly 200, the latch assembly 400 secures the SSD 150, 150' (shown in FIG. 1A-B) to the PCBA 100, 100' (shown in FIG. 1A-1B). The latch assembly 400 includes a latch mechanism 405 and a securing element 420. The latch mechanism 405 can include a latch 410 and a connector element 415. The securing element 420 can include a first feature 425, a second feature 430, third feature 435, and a fourth feature 440. The securing element 420, including the first feature 425, second feature 430, third feature 435 and fourth feature 440, can be cylindrical in shape.

The latch assembly 400 and its components can be made from a single flexible yet durable element, such as plastic. In some embodiments, the latch mechanism 405 can be made from a single flexible yet durable element, while the securing element 420 is made from more rigid materials. Because the securing element 420 is rigid in comparison with the latch mechanism 405, the securing element 420 and its components can be made of sheet metal using conventional metal fabrication techniques such as bending, forming, and stamping. As a result, the securing element 420 can be made inexpensively. Alternatively, the securing element 420 and its components can be made of aluminum alloy, steel alloy, or any combination thereof.

Furthermore, the latch assembly 400 and its components can be made of any material constructed to withstand varying temperatures, and air flow of high velocity (from a plurality of fan modules not shown). The materials mentioned above are only for example, and not intended to limit this disclosure. A person having ordinary knowledge in the art may flexibly select any material in accordance with the disclosure.

As shown in FIG. 10, the PCBA 100 can include an aperture (not shown) configured to receive the fourth feature 440 of the securing element 420. The fourth feature 440 of the securing element 420 can include a tapered area configured to be inserted within the PCBA 100. The fourth feature 440 and the aperture (not shown) of the PCBA 100 can have corresponding circumferences (where the aperture is slightly larger) that allows for a perfect fit between the two parts. In other embodiments, the fourth feature 440 and the aperture (not shown) of the PCBA 100 can have an interference fit—where the condition of the fit (contact) between the two parts requires pressure to force the parts together. The third feature 435 of the securing element 420 can include a larger circumference than the fourth feature 440 of the securing element 420. In this way, third feature 435 of the securing element 420 can sit on the top surface of the PCBA 100, as shown in FIG. 11.

As shown in FIG. 12, the securing element 420 can include a first feature 425 and a second feature 430. The second feature 430 has a smaller circumference than the first feature 425. The second feature 430 is configured to receive the connector element 415 of the latch mechanism 405. The connector element 415 of the latch mechanism 405 can include a notch feature, a spring feature, a magnetic feature, or any other known mechanical features configured to connect the latch mechanism 405 to the securing element 420. In preferred embodiments, the connection between the latch mechanism 405 and the securing element 420 is flush and detachable upon asserting force. The latch mechanism 405 can include a locking mechanism 445 configured to secure the latch mechanism to the PCBA 100. The PCBA 100 can include a second aperture (not shown) configured to receive the locking mechanism 445. The locking mechanism 445 can be configured in such a way where the latch mechanism 405 is pressed in the downward position to engage the second aperture (not shown). Upon engagement with the second aperture (not shown), the latch mechanism 405 can be driven forward towards the securing element 420 to lock the latch mechanism 405 in place on the PCBA 100. The assembly of the latch mechanism 405 and the securing element 420 is tool less and configurable without being onerous on a technician. FIG. 13 illustrates the latch assembly 400 secured to the PCBA 100.

Referring now to FIGS. 14-17, FIG. 17 illustrates a fourth embodiment of a latch assembly 500 secured to the PCBA 100. As described above, with respect to the latch assembly 200, the latch assembly 500 secures the SSD 150, 150' (shown in FIG. 1A-B) to the PCBA 100, 100' (shown in FIG. 1A-1B). The latch assembly 500 includes a latch mechanism 505 and a securing element 520. The latch mechanism 505 can include a latch 510 and a receiving space 515. The receiving space 515 can include a magnet 516 or a magnetic metal component. The securing element 520 can include a first feature 530 and a second feature 535. The first feature 530 can include a corresponding magnet, or a magnetic metal component 531. The securing element 520, including the first feature 530 and the second feature 535, can be cylindrical in shape.

The latch assembly 500 and its components can be made from a single flexible yet durable element, such as plastic. In some embodiments, the latch mechanism 505 can be made from a single flexible yet durable element, while the securing element 520 is made from more rigid materials. Because the securing element 520 is rigid in comparison with the latch mechanism 505, the securing element 520 and its components can be made of sheet metal using conventional metal fabrication techniques such as bending, forming, and stamping. As a result, the securing element 520 can be made inexpensively. Alternatively, the securing element 520 and its components can be made of aluminum alloy, steel alloy, or any combination thereof.

Furthermore, the latch assembly 500 and its components can be made of any material constructed to withstand varying temperatures, and air flow of high velocity (from a plurality of fan modules not shown). The materials mentioned above are only for example, and not intended to limit this disclosure. A person having ordinary knowledge in the art may flexibly select any material in accordance with the disclosure.

Figure 15:
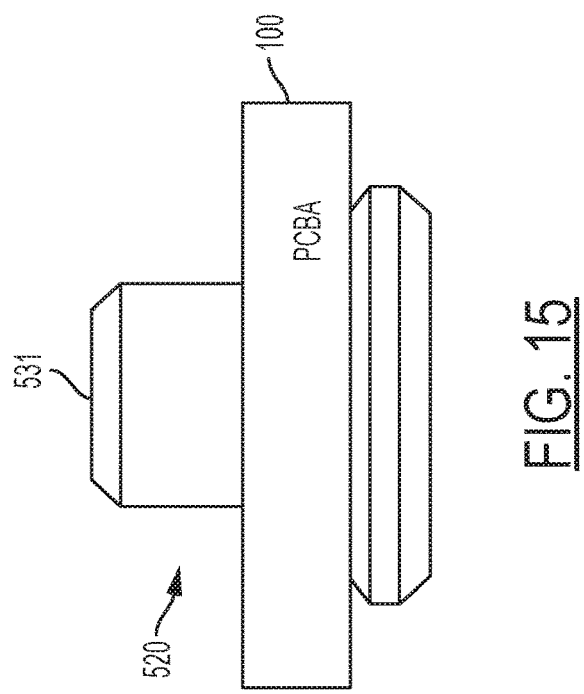
FIG. 15 illustrates the configuration of securing element and the PCBA of FIG. 14, according to the fourth embodiment of the latch assembly.
Figure 14:
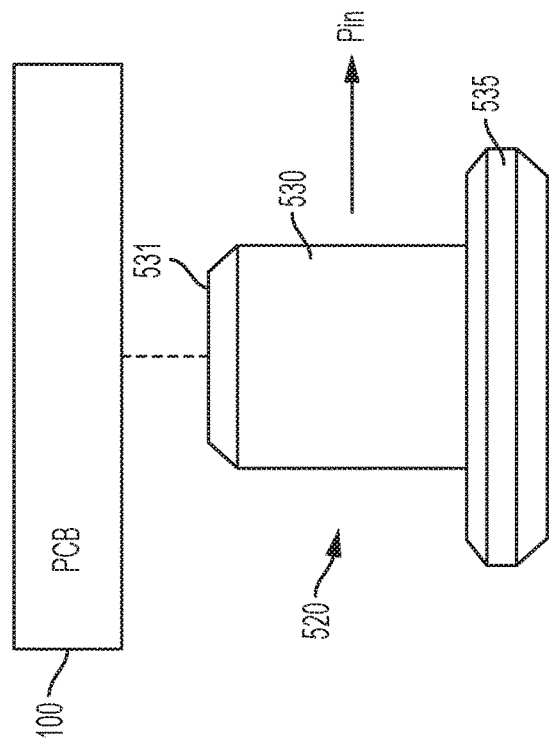
FIG. 14 illustrates the assembly of a securing element with the PCBA, according to a fourth embodiment of a latch assembly.

As shown in FIG. 14, the PCBA 100 can include an aperture (not shown) configured to receive the first feature 530 of the securing element 520. The first feature 530 of the securing element 520 can include a tapered area configured to be inserted within the PCBA 100. The first feature 530 and the aperture (not shown) of the PCBA 100 can have corresponding circumferences (where the aperture is slightly larger) that allows for a perfect fit between the two parts. In other embodiments, the first feature 530 and the aperture (not shown) of the PCBA 100 can have an interference fit—where the condition of fit (contact) between the two parts requires pressure to force the parts together. The second feature 535 of the securing element 520 can include a larger circumference than the first feature 530 of the securing element 520. In this way, second feature 535 of the securing element 520 can reside flush to the bottom surface of the PCBA 100, as shown in FIG. 15. The force from the magnetic configuration (discussed below) will secure the securing element 520 flush against the bottom surface of the PCBA 100.

Figure 16:
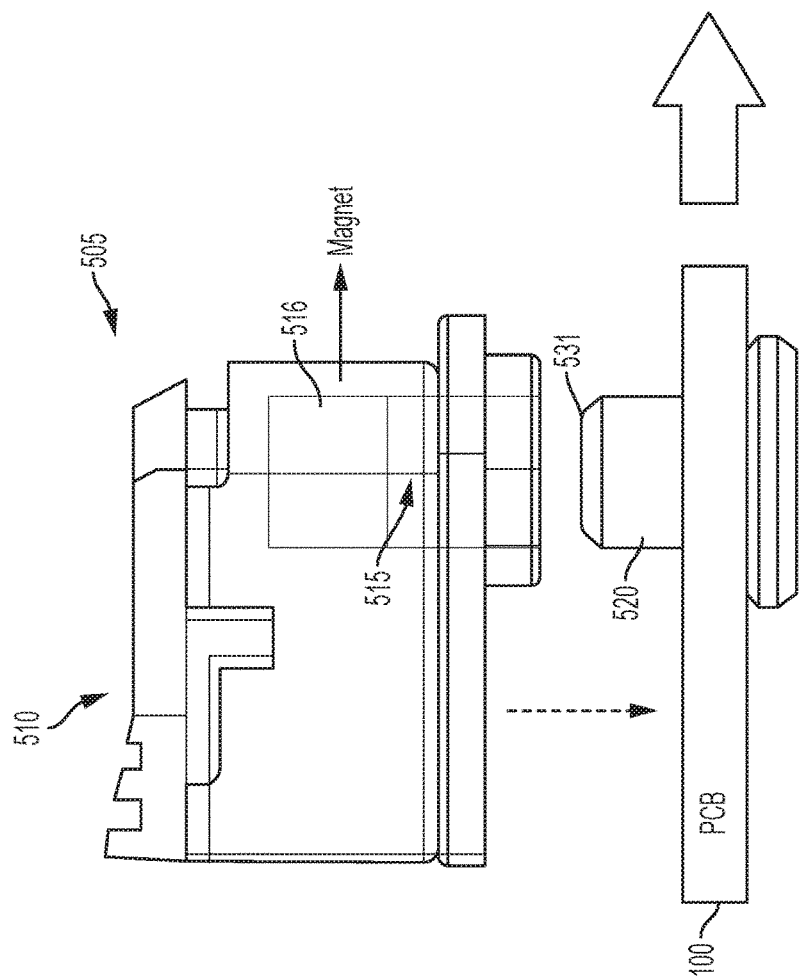
FIG. 16 illustrates the assembly of a latch mechanism, the securing element, and the PCBA of FIG. 15, according to the fourth embodiment of the latch assembly.

As shown in FIG. 16, the securing element 520 can include a first feature 530 protruding from the top surface of the PCBA 100. The first feature 530 can include a magnet 531 located at the tapered portion. The latch mechanism 505 can include a latch 510 and a receiving space 515. The receiving space 515 can include a magnet 516 or a magnetic metal component configured to magnetically connect to the magnet 531 of the securing element 520. The magnetic connection of both the magnet 531 and the magnet 516 can secure the latch mechanism 505 to the securing element 520. The force of both magnets can drive the latch mechanism 505 downward into the PCBA 100, while simultaneously driving the securing element 520 upward into the PCBA 100. The resulting forces combine to create a connection between the latch mechanism 505 and the securing element 520 that is flush and detachable upon asserting force in the opposite direction.

Figure 17:
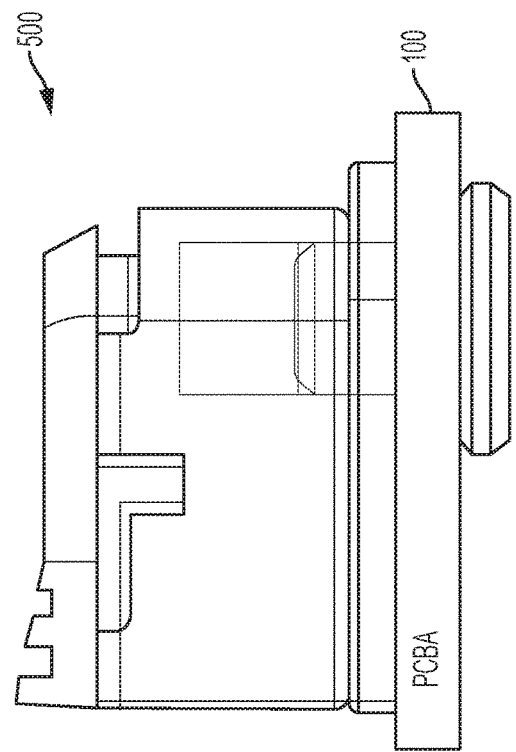
FIG. 17 illustrates the configuration of the fourth embodiment of the latch assembly.

It should be noted, that while both features can include a magnet (531 and 516), only one feature needs to be a magnet. The other corresponding (non-magnet) feature can include a magnetic metal component. For example, in some embodiments, the entire securing element 520 is comprised of a magnetic metal component that is configured to be magnetically charged to the magnet 516. In other embodiments, just the tapered surface of the first feature 530 can be comprised of a magnetic metal component that is configured to be magnetically charged to the magnet 516. The assembly of the latch mechanism 505 and the securing element 520 is tool less and configurable without being onerous on a technician. FIG. 17 illustrates the latch assembly 500 secured to the PCBA 100.

While various embodiments of the present invention have been described above, it should be understood that they have been presented by way of example only, and not limitation. Numerous changes to the disclosed embodiments can be made in accordance with this disclosure without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to limit the invention. As used herein, the singular forms "a", "an", and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A computing device, comprising:
   an electronic component having various sizes including a first size and a second size;
   a printed circuit board assembly (PCBA) comprising at least two latch receiving spaces, the at least two latch receiving spaces including a first latch receiving space and a second latch receiving space; and
   a latch assembly configured to be connected to the computing device at one of the at least two latch receiving spaces for securing the electronic component, wherein the at least two latch receiving spaces are positioned on the PCBA to accommodate the various sizes of the electronic component,
   wherein the latch assembly comprises:
      a base comprising a first connecting receiving space and a second connecting receiving space;
      a latch mechanism that is a separate component than the base and that is movable relative to the base, the latch mechanism having a connecting feature configured to connect the latch mechanism to the first connecting receiving space of the base in a first direction that is generally parallel to a top surface of the PCBA, and
      a securing element connected to the second connecting receiving space of the base in a second direction that is generally perpendicular to the top surface of the PCBA, the securing element being mounted to the first latch receiving space of the PCBA when the electronic component has the first size, the securing element being mounted to the second latch receiving space of the PCBA when the electronic component has the second size, wherein the securing element has at least two cylindrical elements of different sizes, the securing element being mounted to the PCBA via one of the two cylindrical elements and to the base via another one of the two cylindrical elements.

2. The computing device of claim 1, wherein the connecting feature of the latch mechanism includes a magnet configured to magnetically connect to the first connecting receiving space of the base.

3. The computing device of claim 1, wherein the securing element is configured to connect to the base via an aperture within the PCBA, the securing element having at least one cylindrical element with a circumference sized for a perfect fit to a circumference of the aperture.

4. The computing device of claim 1, wherein the securing element has at least two cylindrical elements of different sizes, one of the two cylindrical elements having a feature that is configured to reside flush against a bottom surface of the PCBA.

5. The computing device of claim 1, wherein the securing element has at least one cylindrical element with a a tapered feature that includes a magnetic metal component.

6. The computing device of claim 1, wherein the securing element has at least one cylindrical element configured to reside flush against the top surface of the PCBA.

7. The computing device of claim 1, wherein the connecting feature of the latch mechanism includes a notch feature configured to connect to the base.

8. The computing device of claim 1, wherein the securing element includes at least one of a threaded screw, a bolt, and a non-threaded connecting feature for connecting to the base.

9. The computing device of claim 1, wherein the second connecting receiving space of the base is a threaded interior space for connecting to the securing element.

10. The computing device of claim 1, wherein the connecting feature of the latch mechanism includes at least one of a a spring feature and a magnetic feature for connecting the latch mechanism to the base.

11. The computing device of claim 1, wherein the latch mechanism and the base are connected in a flush configuration and detachable upon asserting force.

12. The computing device of claim 1, wherein the base includes a tool-less feature configured to connect to the PCBA the base, the latch mechanism, and the securing element.

13. The computing device of claim 1, wherein the first connecting space of the base includes a threaded screw configured to connect to the securing element.

* * * * *